(12) United States Patent
Cohen

(10) Patent No.: US 7,709,958 B2
(45) Date of Patent: May 4, 2010

(54) METHODS AND STRUCTURES FOR INTERCONNECT PASSIVATION

(76) Inventor: Uri Cohen, 4147 Dake Ave., Palo Alto, CA (US) 94306

( * ) Notice: Subject to any disclaimer, the term of this patent is extended or adjusted under 35 U.S.C. 154(b) by 633 days.

(21) Appl. No.: 11/156,122

(22) Filed: Jun. 17, 2005

(65) Prior Publication Data
US 2006/0249849 A1 Nov. 9, 2006

Related U.S. Application Data

(60) Provisional application No. 60/581,285, filed on Jun. 18, 2004.

(51) Int. Cl.
*H01L 23/48* (2006.01)
(52) U.S. Cl. .......... 257/762; 257/750; 257/751; 257/758; 257/773; 257/774; 257/E23.141; 257/E23.151; 257/E23.152; 257/E23.154
(58) Field of Classification Search .......... 257/758, 257/751, E23.011, 750, 762, 773, 774, E23.141, 257/E23.151, E23.152, E23.154; 438/653
See application file for complete search history.

(56) References Cited

U.S. PATENT DOCUMENTS

| | | | |
|---|---|---|---|
| 4,330,347 A | 5/1982 | Hirayama et al. | 148/31.5 |
| 4,612,410 A | 9/1986 | Hewig et al. | 136/256 |
| 4,755,394 A | 7/1988 | Aoki et al. | 427/123 |
| 4,851,895 A * | 7/1989 | Green et al. | 257/751 |
| 5,281,304 A | 1/1994 | Kadomura | 156/656 |
| 5,451,542 A | 9/1995 | Ashby | 437/173 |
| 5,863,834 A | 1/1999 | Kawaguchi et al. | 438/625 |
| 5,913,147 A * | 6/1999 | Dubin et al. | 438/687 |
| 5,953,628 A * | 9/1999 | Kawaguchi | 438/635 |
| 6,181,012 B1 * | 1/2001 | Edelstein et al. | 257/751 |
| 6,181,013 B1 | 1/2001 | Liu et al. | 257/762 |
| 6,228,759 B1 | 5/2001 | Wang et al. | 438/625 |
| 6,313,538 B1 * | 11/2001 | Zistl et al. | 257/760 |
| 6,429,117 B1 | 8/2002 | Sudijono et al. | 438/627 |
| 6,433,429 B1 * | 8/2002 | Stamper | 257/751 |
| 6,683,002 B1 * | 1/2004 | Chooi et al. | 438/687 |
| 6,686,263 B1 * | 2/2004 | Lopatin et al. | 438/584 |
| 6,689,689 B1 | 2/2004 | Besser et al. | 438/687 |
| 6,713,373 B1 * | 3/2004 | Omstead | 438/608 |
| 6,798,068 B2 | 9/2004 | Oglesby | 257/759 |
| 6,836,017 B2 * | 12/2004 | Ngo et al. | 257/751 |
| 6,841,473 B1 * | 1/2005 | Avanzino et al. | 438/661 |
| 6,858,527 B2 | 2/2005 | Gracias | 438/628 |
| 6,873,057 B2 | 3/2005 | Chen et al. | 257/777 |
| 6,893,895 B1 | 5/2005 | Okoroanyanwu et al. | 438/99 |
| 6,916,696 B1 * | 7/2005 | Buynoski | 438/200 |
| 7,205,228 B2 * | 4/2007 | Padhi et al. | 438/652 |
| 2002/0027261 A1 | 3/2002 | Besser et al. | 257/584 |

(Continued)

OTHER PUBLICATIONS

E. J. King, "Qualitative Analysis and Electrolytic Solutions", Harcourt, Brace & World, Inc., 1959, pp. 140-143; 156-157; 178-185; 392-397.

(Continued)

*Primary Examiner*—Kenneth A Parker
*Assistant Examiner*—Jay C Kim

(57) ABSTRACT

One or more embodiments of the present invention relate to structures obtained by methods (a) for growing a film by an intermixing growth process, or (b) by depositing a film, which film includes chalcogenides of copper and/or silver (but excluding oxides), such as, for example, copper sulfide ($CuS_X$ and/or $Cu_2S_X$, where $0.7 \leq X \leq 1.3$; and $X=1.0$ for stoichiometric compounds).

14 Claims, 4 Drawing Sheets

U.S. PATENT DOCUMENTS

| | | | |
|---|---|---|---|
| 2003/0116439 A1 | 6/2003 | Seo et al. .................... | 205/125 |
| 2003/0135061 A1 | 7/2003 | Norman et al. ................ | 556/9 |
| 2004/0051117 A1 | 3/2004 | Chyan et al. ................ | 257/200 |
| 2004/0227247 A1 | 11/2004 | Chooi et al. ................ | 257/758 |
| 2004/0238961 A1 | 12/2004 | Cunningham ............... | 257/758 |
| 2004/0251549 A1 | 12/2004 | Huang et al. ................ | 257/758 |
| 2005/0093162 A1 | 5/2005 | Gracias ....................... | 257/759 |
| 2005/0127479 A1 | 6/2005 | Cohen ........................ | 257/627 |
| 2005/0212139 A1* | 9/2005 | Leinikka et al. ............. | 257/762 |
| 2005/0227382 A1* | 10/2005 | Hui ............................. | 438/14 |

OTHER PUBLICATIONS

Metals Handbook, vol. 8, 8$^{th}$ Edition (1973), American Society for Metals, pp. 297; 300; 358.

S. K. Ghandhi, "VLSI Fabrication Principles", John Wiley & Sons, 1983, pp. 377-383.

H. Itow et al., "Self-aligned passivation on copper interconnection durability against oxidizing ambient annealing", Appl. Phys. Letters 63(7), Aug. 16, 1993, pp. 934-936.

R.V.A. Rowe et al., "Low-resistance films of polyimides with impregnated copper sulfide", J. Mater. Res. vol. 16, No. 11, Nov. 2001, pp. 3097-3106.

J. Johansson et al., "Growth of conductive copper sulfide thin films by atomic layer deposition", J. Mater. Chem., 2002, vol. 12, pp. 1022-1026.

I. Ancutiene, "Modification of Polyethylene of Various Density by Layers of Copper Sulfide", ISSN 1392-1320 Materials Science (Medziagotyra), vol. 9, No. 4, 2003, pp. 351-354.

S. Arai et al., "Effect of S on Passivation of Ni Plating", J. Electrochem. Soc., 151 (1), 2004, pp. C 1 5-C18.

B. Lee, "Electroless CoWP Boosts Copper Reliability, Device Performance", Semiconductor International, Jul. 2004, pp. 95-100.

J. Cardoso et al., "Conductive copper sulfide thin films on polyimide foils", 2001 Semicond. Sci. Technol., vol. 16 (2001), pp. 123-127.

T. Sakamoto et al., "Nanometer-scale switches using copper sulfide", Appl. Phys. Letters vol. 82 (18), May 5, 2003, pp. 3032-3034.

I. Grozdanov, "A simple and low-cost technique for electroless deposition of chalcogenide thin films", Semicond. Sci. Technol. vol. 9 (1994), pp. 1234-1241.

A. Neisser et al., "Cu(ln,Ga)S$_2$ Phase Formation from Metallic Cu-In-Ga Precursor Stacks in Rapid Thermal Processes", Mat. Res. Soc. Symp. Proc. vol. 668 (2001), pp. H1.3.1-H1.3.6.

I. V. Luck et al., "Growth Monitoring of Cu-Poor Prepared CuInS$_2$ Thin Films", Mat. Res. Soc. Symp. Proc. vol. 668 (2001), pp. H1.4.1-1-11.4.6.

J. Titus et al., "Post-Deposition Sulfur Incorporation into CuInSe$_2$ Thin Films", Mat. Res. Soc. Symp. Proc. vol. 668 (2001), pp. H1.5.1-H1.5.6.

T. Wada et al., "Physical Vapor Deposition of Cu(ln,Ga)Se$_2$ Films for Industrial Applications", Mat. Res. Soc. Symp. Proc. vol. 668 (2001), pp. H2.1.1-H2.1.12.

N. G. Dhere et al., "CIGS2 Thin Film Solar Cells On Stainless Steel Foil", Mat. Res. Soc. Symp. Proc. vol. 668 (2001), pp. H3.4.1 -H3.4.6.

I. Konovalov et al., "Electronic Properties of Cu-In-S Solar Cells on Cu-Tape Substrate", Mat. Res. Soc. Symp. Proc. vol. 668 (2001), pp. H5.15.1-H5.15.6.

F. Donsanti et al, "Atomic Layer Deposition of Indium Sulfide Layers for Copper Indium Gallium Diselenide Solar Cells", Mat. Res. Soc. Symp. Proc. vol. 668 (2001), pp. H8.20.1-H8.20.8.

D. Guimard et al., "Efficient Cu(ln,Ga)Se2 Based Solar Cells Prepared By Electrodeposition", Mat. Res. Soc. Symp. Proc. vol. 763 (2003), pp. B6.9.1-B6.9.6.

N. Naghavi et al., "Towards Better Understanding of High Efficiency Cd-free CIGS Solar Cells Using Atomic Layer deposition Indium Sulfide Buffer Layers", Mat. Res. Soc. Symp. Proc. vol. 763 (2003), pp. B9.9.1-B9.9.6.

G. A. Armantrout et al., "Photovoltaic Properties of Reactively Sputtered Cu$_x$S Films and Reactively Sputtered Cu$_x$S-CdS Heterojunctions", 13$^{th}$ IEEE Photovoltaic Specialists Conference, 1978, pp. 383-392.

J. J. Loferski et al., "Cathodoluminescence Characterisics of Cu$_x$S Films Produced by Different Methods", Solar Energy Materials, vol. 1 (1979), pp. 157-169.

L. Hmurick, L. Allen, and R. Serway, "The effects of heat treatments on the transport properties of Cu$_x$S thin films", J. Applied Physics, vol. 53(12), Dec. 1982, pp. 9063-9072.

L. H. Allen and E. Bunks, "Copper electromigration in polycrystalline copper sulfide", J. Applied Physics, vol. 56(2), Jul. 1984, pp. 327-335.

L. H. Allen and E. Bunks, "Effect of ionic electromigration on Cu$_{2-\alpha}$S/CdS solar cell", J. Applied Physics, vol. 59(4), Feb. 1986, pp. 1360-1365.

S. Cassaignon et al., "Influence of the Composition on the Copper Diffusion in Copper Sulfides", J. of the Electrochemical Society, vol. 146(12), Dec. 1999, pp. 4666-4671.

W. Kai, G.W. Fan, P.C. Chen, and Y.T. Lin, "The Corrosion of Cu-Al Binary Alloys in H2/H2S/H2O Atmosheres at 400-900° C.", Oxidation of Metals, vol. 61, Nos. 5/6, Jun. 2004, pp. 439-461.

* cited by examiner

METHODS AND STRUCTURES FOR INTERCONNECT PASSIVATION

This application claims the benefit of U.S. Provisional Application No. 60/581,285, filed on Jun. 18, 2004, which application is incorporated herein in by reference.

TECHNICAL FIELD OF THE INVENTION

One or more embodiments of the present invention relates to the field of Very Large Scale Integration (VLSI) and Ultra Large Scale Integration (ULSI) semiconductor devices, Thin Film Head (TFH) devices, Micro Electronic Machined Systems (MEMS), and high density electronic device packaging such as, for example and without limitation, Flip Chip, Chip Scale Packaging (CSP), and Wafer Scale Packaging (WSP).

BACKGROUND OF THE INVENTION

In fabricating Damascene and Dual Damascene (DD) copper interconnects in accordance with prior art techniques, copper is encased in one or more copper diffusion barrier layers. Typically, the bilayer Ta/TaN$_X$ is used as a barrier layer for sidewalls and at the bottom of lines, and a relatively high-k dielectric layer, typically silicon nitride (or silicon carbide, or silicon carbide nitride, or silicon oxide carbide nitride), is used as a top capping barrier layer.

Sites of poor adhesion between copper and metallic barrier layers on sidewalls and/or at the bottom of openings may result in electromigration (EM) and/or Stress Induced Voids (SIV). Copper EM and SIV are important reasons for poor reliability and low yields in copper interconnects. Presently used sidewalls and bottom barrier layers, such as Ta, TaN$_X$, Ta/TaN$_X$, Ru, TaSi$_X$N$_Y$, WN$_X$, Ti/TiN$_X$, TiSi$_X$N$_Y$, or WSi$_X$N$_Y$, are problematic because: (a) their relatively high resistivity increases the resistance of interconnect lines and vias—this is particularly problematic at the bottom of vias; (b) they may have poor adhesion to copper and/or to the dielectric surrounding the interconnect (inter layer dielectric or ILD), resulting in high EM and/or SIV; and (c) they are often discontinuously deposited by a PVD technique over sidewalls of high aspect ratio (HAR) Damascene and Dual Damascene vias and trenches (particularly on hard to reach lower sidewalls of HAR openings, and on negative slope vicinities of undercut crevices, nooks, and crannies)—which discontinuities provide easy diffusion routes for copper into surrounding dielectric and/or copper voids.

In light of the above, there is a need for methods and materials that solve one or more of the above-identified problems.

SUMMARY OF THE INVENTION

One or more embodiments of the present invention solve one or more of the above-identified problems. In particular, one or more embodiments of the present invention relate to methods for growing a film by an intermixing growth process or by depositing a film comprising chalcogenides of copper and/or silver (but excluding oxides), such as copper sulfide (CuS$_X$ and/or Cu$_2$S$_X$, where $0.7 \leq X \leq 1.3$; and $X=1.0$ for stoichiometric compounds) over the sidewalls and/or bottom surfaces of the interconnect.

DETAILED DESCRIPTION

Top Capping

Figure 1A:
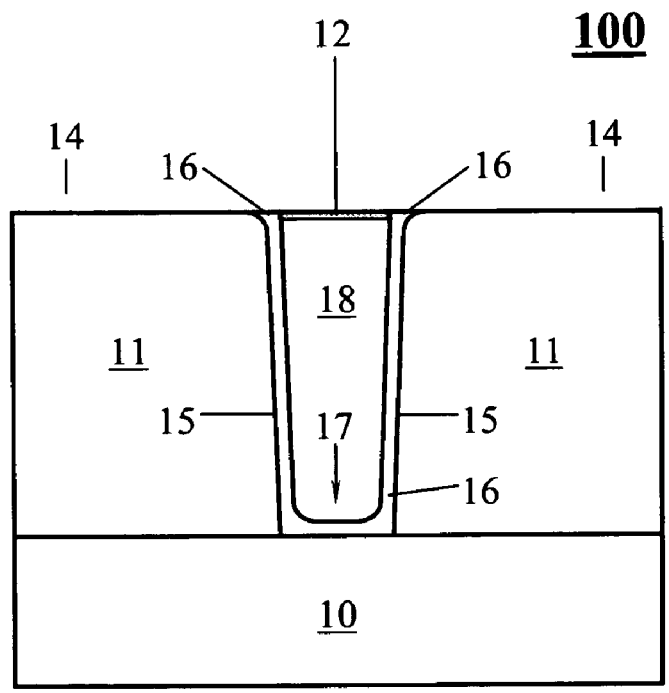
FIGS. 1(a)-1(b) show a pictorial representation of a transverse (along the width) cross-section of an interconnect structure used to fabricate, for example and without limitation, a semiconductor device that includes a conductor structure fabricated in accordance with one or more embodiments of the present invention.
Figure 1B:
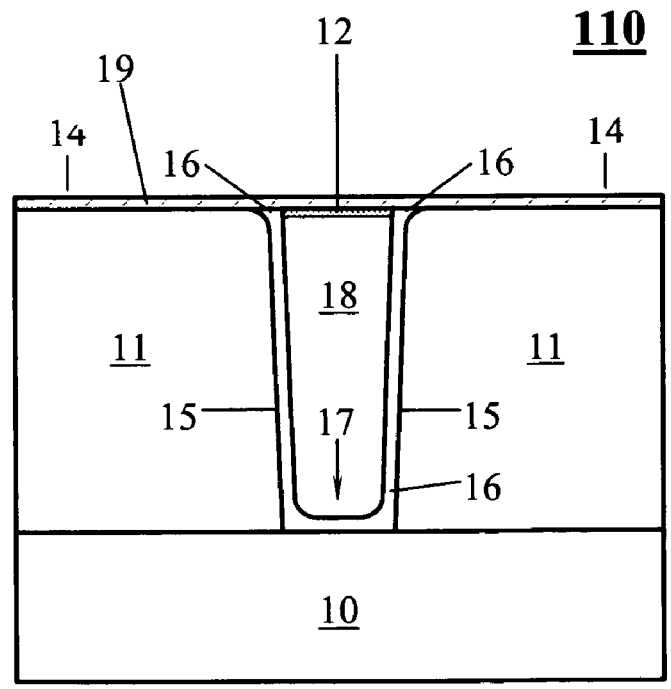

FIG. 1(a) shows a pictorial representation of a transverse (along the width) cross-section (not to scale for ease of understanding) of structure 100 used to fabricate, for example and without limitation, a semiconductor device that includes a conductor structure comprised of conductive interconnect 18. Conductive interconnect 18 may comprise a metal or metal alloy such as, for example and without limitation, Cu, Ag, or alloys comprising one or more of these metals. Structure 100 may be fabricated as follows. In accordance with any one of a number of methods that are well known to those of ordinary skill in the art, dielectric layer 11 may be deposited over substrate 10, which substrate 10 may comprise one or more layers such as, for example and without limitation, a lower metallization level and/or another dielectric layer. Next, in accordance with any one of a number of methods that are well known to those of ordinary skill in the art, an opening having sidewall surfaces 15 and bottom surface 17 may be pattern-etched in dielectric layer 11, and barrier layer 16 and one or more seed layers (not shown in FIG. 1) may be deposited over sidewalls 15 and bottom surface 17 of the opening. Barrier 16 may comprise, for example and without limitation, a refractory metal or an alloy comprising a refractory metal, such as Ta, TaN$_X$, Ta/TaN$_X$, Ru, TaSi$_X$N$_Y$, WN$_X$, Ti/TiN$_X$, TiSi$_X$N$_Y$, or WSi$_X$N$_Y$. One or more seed layers (not shown) are then deposited over the metallic barrier layer 16. Next, in accordance with any one of a number of methods that are well known to those of ordinary skill in the art, for example and without limitation, using electrofilling methods, the opening may be filled with conductive interconnect 18. Next, in accordance with any one of a number of methods that are well known to those of ordinary skill in the art, for example and without limitation, using one or more planarization and/or removal techniques, such as chemical mechanical polishing (CMP), polishing, electro-dissolution, electropolishing, or chemical etching, excess conductor in conductor 18 and excess conductor over dielectric 11 in field 14, as well as any seed and barrier layers overlying field 14, may be removed to expose a top surface of conductor interconnect metal 18 and a top surface of field 14. This step is sometimes referred to in the art as a removal or planarization step.

In accordance with one or more embodiments of the present invention, following the removal or planarization step, the exposed top surface of conductor interconnect 18 is covered with passivation film 12. In accordance with one or more embodiments of the present invention, the step of covering the exposed top surface of conductor interconnect 18 with passivation film 12 comprises providing passivation film 12 over the exposed top surface of conductive metal 18 by, for example and without limitation, an intermixing growth process or a deposition process.

The term "intermixing growth" process is defined herein as a process in which a film grows on a surface of a material, which film comprises one or more constituents of the material and one or more constituents of a reactant. One example, without limitation, of an intermixing growth process involves diffusion across a growing film of one or more constituents from the material to the surface of the growing film, and/or diffusion across the growing film of one or more constituents from the reactant to the interface between the material and the growing film. For example and without limitation, silicon dioxide growth by oxidation of a silicon surface (such as described in a book entitled "VLSI Fabrication Principles" by S. K. Ghandhi, pp. 377-383, John Wiley & Sons, Inc. (1983)) is an intermixing growth process. The term "deposition" is defined herein as any process in which all of the constituents of a film originate from reagents external to the surface of a material. Some examples, without limitation, of deposition processes are electrodeposition, electroless deposition, chemical bath deposition (CBD), physical vapor deposition (PVD), chemical vapor deposition (CVD), and atomic layer deposition (ALD).

A. Intermixing Growth

In accordance with one or more embodiments of the present invention, passivation film 12 may be fabricated by reacting the exposed top surface of conductor interconnect 18 with one or more reactants to fabricate one or more materials that adhere strongly to the exposed conductor 18 surface. In accordance with one or more such embodiments, it is believed that strong adhesion is provided because at least one of such materials is chemically bonded to the material at the exposed top surface of conductor interconnect 18. Advantageously, in accordance with one or more of such embodiments, it is believed that passivation film 12 grows selectively, i.e., it grows only on exposed surface of conductor interconnect 18, and not on dielectric 11 at the exposed surface of field 14.

In accordance with one or more embodiments of the present invention, conductor interconnect 18 comprises copper or a copper alloy, and passivation film 12 comprises a copper sulfide such as $CuS_X$ and/or $Cu_2S_X$ (where $0.7 \leq X \leq 1.3$; and $X=1.0$ for stoichiometric compounds), and/or other materials comprising one or more of these compounds. Copper sulfide film 12 can be grown by an intermixing growth process, for example and without limitation, by sulfidation of (or reacting) the exposed top surface of copper interconnect 18 with a sulfur-bearing reactant gas (or gas mixture) comprising sulfur atoms, molecules, or ions such as, for example and without limitation, $H_2S$ or vapors of elemental sulfur ($S_n$; where n is an integer). It is believed that in accordance with such embodiments, copper sulfide film 12 is grown by an intermixing growth process according to the following chemical reactions:

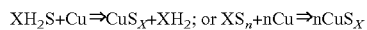

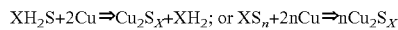

The rate of growth of film 12 can be increased or decreased by raising or lowering, respectively, the temperature of structure 100 and/or the reactant gas. The growth rate can also be increased or decreased by increasing or decreasing, respectively, the concentration (or partial pressure) of the reactant gas.

For example and without limitation, copper sulfide film 12, having a thickness of about 10 Å to about 2,000 Å, can be grown by an intermixing sulfidation process on the top surface of copper conductor 18 by subjecting a wafer with exposed conductor 18 to an $H_2S$ gas (or a gas mixture of $H_2S$ with inert gas, such as argon or nitrogen), or to a sublimed sulfur vapor, at a temperature from about 25° C. to about 500° C. The dry sulfidation can be performed in a furnace, such as a rapid thermal processing (RTP) furnace, a CVD chamber, or a plasma enhanced CVD (PECVD) chamber at sulfidation times ranging from a few seconds to about 10 minutes. The higher the substrate temperature and/or the longer the exposure time, the thicker the copper sulfide film 12, and vice versa.

Copper sulfide film 12 may also be grown by an intermixing growth process in accordance with one or more further embodiments of the present invention by reacting the exposed top surface of copper interconnect 18 with a wet solution which contains one or more sulfur-bearing compounds comprising sulfur atoms, molecules, or ions, such as, for example and without limitation, solutions comprising elemental sulfur ($S_n$) or sulfide ions ($S^{-2}$) of $Na_2S$, $K_2S$, $(NH_4)_2S$, and dissolved $H_2S$. It is believed that in accordance with such embodiments, copper sulfide film 12 is grown by an intermixing growth process according to the following chemical reactions:

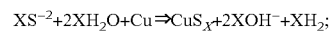

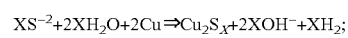

In accordance with one or more of such embodiments, dipping or spraying the top surface of copper interconnect 18 in the wet solution is continued until a predetermined thickness of film 12 is approached or attained (as will be described below, it is believed that the predetermined thickness may be a self-limited thickness). The rate of growth of film 12 can be increased or decreased by raising or lowering, respectively, the temperature of the wet solution and/or structure 100. The growth rate of film 12 can also be increased or decreased by increasing or decreasing, respectively, the concentration of the sulfur-bearing reactant in the solution.

It may be advantageous to grow film 12 by an intermixing self-limiting growth process, to its self-limited thickness at a temperature higher (for example and without limitation, by at least 50° C., and more specifically, by at least 100° C.) than the operational temperatures attained during device operation. It is believed that this will help to reduce copper diffusion across film 12 during operation of the device, or it might even substantially prevent such copper diffusion. In such a case, passivation film 12 can also function (and be used) as a diffusion barrier layer, in addition to its passivation role (by immobilizing top surface atoms of conductor 18). However, as is well-known, the actual growth temperature might be limited by a thermal budget, or by other processing and/or integration considerations, and a trade-off might be required. In light of this information, appropriate values of temperature can be determined for a particular application by one of ordinary skill in the art routinely and without undue experimentation. "Self-limited thickness" is defined herein as the thickness attained after a certain growth time, Δt (at a specific growth temperature), which increases by less than about 25% when the growth time is extended by another Δt, or more. For example, if the thickness of film 12 is about 200 Å after 5 minutes growth at a given temperature, and it is less than about 250 Å after additional 5 minutes growth at the same temperature, then the self-limited thickness of film 12 is about 200 Å. The self-limited thickness is a strong function of the growth temperature, increasing with the growth temperature. It is believed that the thickness of passivation film 12 has to be larger than about 300 Å and, probably larger than about 500 Å, for it to function as an efficient diffusion barrier. Using film 12 alone as a diffusion barrier (see FIG. 1(a)), without dielectric barrier layer 19, would have the distinct advantages of significantly reducing the effective dielectric constant ($k_{eff}$) of the multilevel interconnect, while improving its reliability, structural strength, and integrity.

In General, the $Cu_2S_X$ phases are thermally more stable than the $CuS_X$ phases. For example, the $Cu_2S_X$ δ-phase has a maximum melting point of 1,131° C., whereas the $CuS_X$ ∈-phase is not stable above 507° C., and undergoes phase transformations at 76° C. and at 115° C. See Metals Handbook, $8^{th}$ Edition, Vol. 8, pages 297, 300, 358, American Society for Metals, 1973. A reference herein to a $Cu_2S_X$ phase may also include the case of more than a single phase and, similarly, a reference herein to a single $CuS_X$ phase may also include the case of more than a single phase. It is believed that when film 12 comprises the $Cu_2S_X$ phase, it is more stable and, therefore, may be more desirable. As a result, if film 12 is formed (by intermixing growth) by reacting a sulfur-bearing reactant gas or vapor on copper conductor 18, at temperatures above about 507° C., only the $Cu_2S_X$ phase is formed. Similarly, if film 12 is first formed as the phase $CuS_X$ (alone or in a multiple phase structure) and, if the film is subsequently heated (or annealed) to above about 507° C., then film 12 will convert to the $Cu_2S_X$ phase.

However, depending on the thickness of film 12 and subsequent heating (or annealing), film 12 may convert entirely into the $Cu_2S_X$ phase at even lower temperatures than about 500° C. For example, it is believed that a relatively thin (about 30 Å to about 200 Å) copper sulfide(s) film 12 will convert entirely into the $Cu_2S_X$ phase by annealing it for a relatively short time (about 0.5 minute to about 10 minutes) at a temperature between about 100° C. to about 400° C. and, more specifically, between about 150° C. to about 300° C. It is believed that film 12 converts to the $Cu_2S_X$ phase by reacting with excess copper on the conductor 18 side, while there is no fresh supply of sulfur species on the other side of film 12. Thicker film 12 may require longer annealing time and/or higher annealing temperature to fully convert into the $Cu_2S_X$ phase. Subsequent annealing of film 12 can be performed as a separate dedicated processing step, or during another elevated temperature processing step such as, for example and without limitation, during deposition of dielectric barrier 19 in FIG. 1(b), for example, by a CVD or a PECVD process. For example, it is believed that when the thickness of film 12 is in a range of about 30 Å to about 200 Å, the processing temperature during a subsequent CVD or plasma enhanced CVD (PECVD) deposition step (for example and without limitation, of a silicon nitride or a silicon carbide barrier layer 19) is sufficiently high and is present for a long enough time to fully convert any other phase(s) of film 12 into the $Cu_2S_X$ phase.

In accordance with one or more still further embodiments of the present invention, film 12 grown by an intermixing growth process on copper interconnect 18 comprises one or more of $CuSe_X$, $Cu_2Se_X$, $CuTe_X$, $Cu_2Te_X$ (where $0.7 \leq X \leq 1.3$; and X=1.0 for stoichiometric compounds)—where copper selenide refers to $CuSe_X$ and/or $Cu_2Se_X$ and copper telluride refers to $CuTe_X$ and/or $Cu_2Te_X$. In still further embodiments, film 12 comprises one or more of $CuS_X$, $Cu_2S_X$, $CuSe_X$, $Cu_2Se_X$, $CuTe_X$, $Cu_2Te_X$ (where $0.7 \leq X \leq 1.3$; and X=1.0 for stoichiometric compounds), and other materials comprising one or more of these compounds.

Copper selenide can be grown by an intermixing growth process by reacting the exposed top surface of copper interconnect 18 with a wet reactant, or a dry reactant gas (or gas mixture) or vapor of one or more selenium-bearing compounds comprising selenium atoms, molecules, or ions. Copper telluride can be grown by an intermixing growth process by reacting the exposed top surface of copper interconnect 18 with a wet reactant, or a dry reactant gas (or gas mixture) or vapor of one or more tellurium-bearing compounds comprising tellurium atoms, molecules, or ions. For example, in order to grow copper selenide by an intermixing growth process on the copper surface, the copper surface may be reacted with (for example and without limitation) $H_2Se$, $Na_2Se$, $K_2Se$, or $(NH_4)_2Se$. Similarly, in order to grow copper telluride by an intermixing growth process on the copper surface, the copper surface may be reacted with (for example and without limitation) $H_2Te$, $Na_2Te$, $K_2Te$, or $(NH_4)_2Te$.

It is believed that one or more of the above-described embodiments for growing film 12 by an intermixing growth process is a self-limiting process. In particular, it is believed that the process is self-limiting by copper and/or sulfur (or sellenium or tellurium) diffusion through (or across) the film as it grows. In particular, it is believed that as the thickness of the growing film increases, the flux of copper species that travel from copper interconnect 18 through film 12 and/or the flux of sulfur (or sellenium or tellurium) species that travel from the surface through film 12 slows down until it or they become substantially negligible or insignificant. In particular, it is believed that a self-limited thickness of film 12 depends on temperature, the density of the film, and its morphology. For example, if the growth temperature is higher, the limiting thickness will be greater (assuming sufficient growth time of the film to its self-limited thickness), and the film will form faster. However, it is also believed that, if the density of the film is so low that there are high rates of diffusion, or if the film contains voids and/or many defects, the process may not be self-limiting. It is further believed that the process is confined to a self-limiting process by enabling diffusion to take place fast enough (during film formation) to growth sites to avoid forming voids. This may be done by raising the growth temperature to ensure that the diffusing species can reach their proper growth sites without forming voids. In light of this information, appropriate values of temperature and reactant concentration or amounts can be determined for a particular application by one of ordinary skill in the art routinely and without undue experimentation.

It should be understood that in some semiconductor processes, the use of compounds containing alkali metal ions might be problematic due to the possibility of contamination. In such cases, for example and without limitation, ammonium sulfide or dissolved $H_2S$ may be used to avoid such alkali metal contamination. Other chemical reagents which comprise sulfur such as, for example and without limitation, elemental sulfur (S), $SO_2$, sulfites, thioacetamide, thiourea, or thiosulfates may also be used to form film 12. As such, one or more embodiments of the present invention include the use of any chemical reagent suitable for reaction with the exposed top surface of conductor 18 to form passivation film 12 comprising a copper sulfide.

Advantageously, film 12 formed as described above is grown on top of conductor interconnect 18, and does not grow on top field 14 of the surrounding dielectric layer 11. As such, growth of passivation film 12 by an intermixing growth process provides a selective process which advantageously helps avoid current leakage through dielectric layer 14. It is further believed that the passivating reactant can advantageously passivate any exposed copper residue (contamination) left on (or embedded onto) field 14 of surrounding dielectric 11 by a previous CMP step. This is advantageous because it may further reduce leakage currents between interconnect lines. In addition, and advantageously in accordance with one or more embodiments of the present invention related to copper interconnect, it is believed that passivation film 12 is chemically bonded to the copper conductor 18 underneath it, thereby adhering well to the top surface of copper (or copper alloy) conductor interconnect 18. As such, it is believed that film 12 can reduce or eliminate copper interfacial surface diffusion and, thereby, reduce or eliminate electromigration (EM).

Copper sulfide passivation film 12 described above is further advantageous because it also adheres well to dielectric layers such as, for example and without limitation, dielectric layers that overlay in structures used to fabricate devices such as semiconductor devices, thereby improving the mechanical strength and the structural integrity of multi-level metallization devices. Furthermore, since copper sulfide film 12 is not a dielectric material (actually it is conductive, having a resistivity $\rho$ value in a range of about $10^{-4}$ to about $10^{-2}$ ohm-cm), it does not increase the effective dielectric constant ($k_{eff}$) of structures 100 or 110. In accordance with one or more embodiments, the thickness of passivation film (or layer) 12 may be in a range from about 10 Å to about 500 Å and, more specifically, in a range from about 50 Å to about 200 Å.

B. Deposition

In accordance with one or more embodiments of the present invention, film 12 may be deposited upon the exposed top surface of conductor interconnect 18. Such a deposition may be carried out by a: (a) dry deposition process such as, for example and without limitation, atomic layer deposition (ALD) or chemical vapor deposition (CVD); (b) physical vapor deposition (PVD) process such as, for example and without limitation, sputtering or evaporation; or (c) wet deposition process such as, for example and without limitation, chemical bath deposition, electrodeposition, or electroless deposition. Except for electroless deposition and electrodeposition, the other deposition processes mentioned above are not selective. For example, using such other deposition processes, copper sulfide will be deposited over the top surface of copper interconnect 18 and the top surface of surrounding dielectric 11 on field 14. As such, the use of non-selective deposition processes may require additional steps for removing copper sulfide deposited over the top surface of dielectric 11 in field 14. In accordance with one or more such embodiments, it is believed that strong adhesion is provided because at least one of such materials is chemically bonded to material at the exposed top surface conductor interconnect 18. In addition, and advantageously in accordance with one or more embodiments of the present invention, because film 12 is chemically bonded to copper underneath it, film 12 adheres well to the top surface of copper interconnect 18. As such, it is believed that film 12 can reduce or eliminate copper surface diffusion, and thereby reduce or eliminate electromigration (EM). It is believed that chemical bonding is enhanced if the temperature of the substrate is elevated during deposition and/or during successive processing steps entailed in fabricating a device.

In accordance with one or more embodiments of the present invention, it is believed that copper atoms at the surface of copper interconnect 18 are chemically bound, for example and without limitation, in a chalcogenide compound comprised of one or more constituents that have a high affinity for copper. In accordance with one or more such embodiments, film 12 may be utilized to passivate the top surface of conductor interconnect 18. In accordance with one or more such embodiments, the thickness of passivation film layer 12 may be in a range from about 10 Å to about 500 Å, and more specifically in a range from about 50 Å to about 200 Å. In addition, film 12 may reduce the effective dielectric constant $k_{eff}$ of a multi-level interconnect structure by reducing the required thickness of (or entirely eliminating) the relatively high-k silicon nitride (or other high-k) dielectric capping layer. Although the description above referred mostly to copper metal (Cu) interconnect and copper sulfide ($CuS_X$ and/or $Cu_2S_X$, where $0.7 \leq X \leq 1.3$; and $X=1.0$ for stoichiometric compounds) films, it should be understood by those skilled in the art that one or more embodiments of the present invention also may be utilized with interconnects comprising any highly conductive metal or alloy, such as, for example and without limitation, silver metal (Ag) or alloys which comprise one or more of the metals Cu and Ag. Similarly, it should be understood that one or more embodiments of the present invention also include films which comprise silver sulfide ($AgS_X$ and/or $Ag_2S_X$, where $0.7 \leq X \leq 1.3$; and $X=1.0$ for stoichiometric compounds) and/or mixtures of other sulfide compounds comprising one or more atoms selected from the group consisting of Cu and Ag. In addition, it should be understood that one or more embodiments of the present invention also include films which comprise copper selenides and/or tellurides, silver selenides and/or tellurides, and mixtures thereof (consisting of one or more of copper and/or silver sulfides, selenides, and tellurides).

Copper sulfide passivation film 12 described above with respect to intermixing growth and deposition processes is further advantageous because it also adheres well to dielectric layers such as, for example and without limitation, dielectric layers that overlay in structures used to fabricate devices such as semiconductor devices, thereby improving the mechanical strength and the structural integrity of multi-level metallization devices. Furthermore, since copper sulfide film 12 is not a dielectric material (actually it is conductive, having a resistivity $\rho$ value in a range of about $10^{-4}$ to about $10^{-2}$ ohm-cm), it does not increase the effective dielectric constant ($k_{eff}$) of structures 100 or 110. In accordance with one or more embodiments, the thickness of passivation film (or layer) 12 may be in a range from about 10 Å to about 500 Å and, more specifically, in a range from about 50 Å to about 200 Å.

C. Capping Passivation Plus Capping Dielectric Barrier

FIG. 1(*b*) shows a pictorial representation of a transverse (along the width) cross-section (not to scale for ease of understanding) of structure 110 used to fabricate, for example and without limitation, a semiconductor device that includes structure 100 shown in FIG. 1(*a*) and a dielectric layer 19 that overlays structure 100. In accordance with one or more embodiments of the present invention, dielectric barrier layer 19 may be utilized as an etch-stop layer (ESL) during etching of successive vias and/or trenches for a higher metallization level. Dielectric barrier layer 19 may also serve as an additional capping diffusion barrier against copper outdiffusion. Dielectric barrier layer 19 may comprise, for example and without limitation, silicon nitride, silicon carbide, silicon carbide nitride, silicon carbide nitride oxide, silicon nitride oxide, $SiC_xH_y$, or $SiC_xO_yH_z$. Dielectric barrier layer 19 may be deposited using any one of a number of deposition processes that are well known to those skilled in the art, for example and without limitation, by a chemical vapor deposition (CVD) or by a plasma enhanced CVD (PECVD), at a temperature range of about 400-500° C., or less. As described above, passivation film 12 adheres well to dielectric layers, and as such, film 12 adheres well to dielectric layer 19. As such, passivation film 12 may significantly improve the strength and structural integrity of multi-level metallization devices.

It is believed that conventional interfaces between copper lines and the capping dielectric barrier (such as silicon nitride or silicon carbide) effectively generate micro-crack precursors which, under thermal and/or mechanical stress, may propagate into the surrounding (mechanically weak) dielectric, thus adversely affecting the structural integrity. It is further believed that, many of the current mechanical strength and structural integration problems associated with low-k dielectrics in advanced interconnect structures (such as CMP delamination and packaging problems), are related to such interfacial micro-cracks precursors. Thus, interposing a copper chalcogenide film, such as a copper sulfide film 12, between the copper lines 18 and the capping dielectric barrier layer 19, with strong adhesion to both, can effectively mitigate or eliminate the deleterious interfacial micro-crack precursors, thereby improving the mechanical strength and structural integrity of the device.

D. Further Processing

When higher levels interconnects are used (not shown), successive vias (not shown) connecting conductor 18 to an upper level metallization interconnect are formed. In order to minimize the successive vias resistance, it may be desirable and/or advantageous to remove passivation film 12 from under the bottom of the successive vias (not shown), prior to copper or silver filling, by a short etching step. In accordance with one or more embodiments of the present invention, passivation film 12 can be selectively removed from under the bottom of successive vias by an etching step such as, for example and without limitation, using a directional dry etching technique such as sputter etching, ion milling, or reactive ion etching (RIE) through the successive vias. Film 12 may also be selectively removed from under the bottom of the vias by wet chemical etching through the successive vias, utilizing, for example and without limitation, $HNO_3$ and/or $H_2SO_4$. Where dielectric barrier layer 19 is formed over film 12, the etching of film 12 can be integrated into the removal (etching) step of layer 19 from the successive vias' bottom, usually by a RIE technique. The chemistry used for etching the dielectric barrier layer 19 may also be utilized for the RIE etching of film 12. Alternatively, film 12 may be removed by a separate subsequent step, utilizing ion milling, or by a different RIE gas chemistry, suitable for the removal of film 12.

Structures comprising successive vias disposed over film 12 and/or dielectric barrier 19, with film 12 and/or dielectric barrier 19 selectively removed from the successive vias' bottom, ensure minimal vias resistance by direct metallic contact to the preceding (i.e., lower) copper metallization level 18.

Sidewalls and Bottom Encasing

Figure 2A:
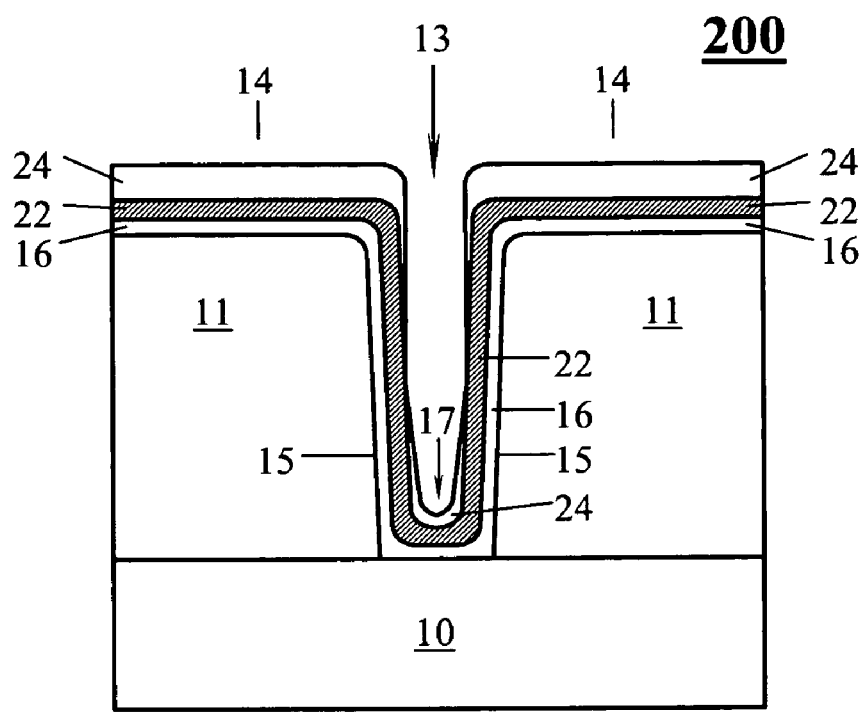
FIGS. 2(a)-2(b) show a pictorial representation of a transverse (along the width) cross-section of an opening with its sidewalls covered with a conformal passivation and/or diffusion barrier film in accordance with one or more embodiments of the present invention.
Figure 2B:
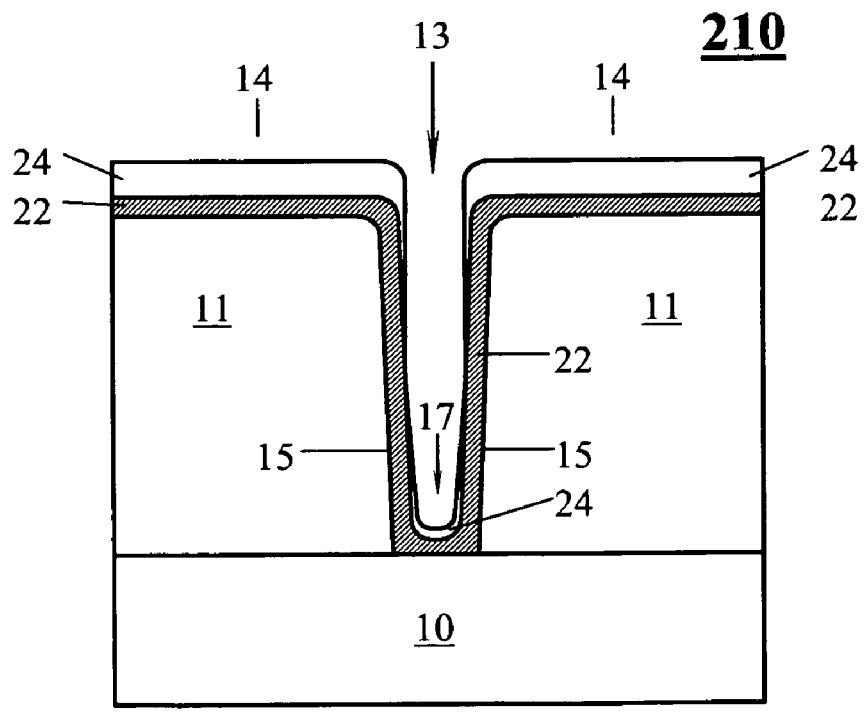

FIG. 2(a) shows a pictorial representation of a transverse (along the width) cross-section (not to scale for ease of understanding) of structure 200 used to fabricate, for example and without limitation, a metallic interconnect in a semiconductor device, wherein opening 13 has sidewalls surfaces 15 and bottom surface 17 covered with metallic barrier layer 16. Metallic barrier layer 16 is covered in turn, with film 22 in accordance with one or more embodiments of the present invention. Opening 13 of structure 200 may subsequently be filled, for example and without limitation, using electroplating (or electrofilling) methods. Structure 200 may be fabricated as follows. In accordance with any one of a number of methods that are well known to those of ordinary skill in the art, dielectric layer 11 may be deposited over substrate 10, which substrate 10 may comprise one or more layers such as, for example and without limitation, a lower metallization level and/or another dielectric layer. Next, in accordance with any one of a number of methods that are well known to those of ordinary skill in the art, opening 13 having sidewalls surfaces 15 and bottom surface 17 may be pattern-etched in dielectric layer 11, and barrier layer 16 may be deposited over sidewalls 15 and bottom surface 17 of opening 13. Metallic barrier layer 16 may comprise, for example and without limitation, at least one layer of one or more refractory metals or alloys comprising refractory metals, such as Ta, $TaN_x$, binary $Ta/TaN_x$, Ru, $TaSi_xN_y$, $WN_x$, binary $Ti/TiN_x$, $TiSi_xN_y$, or $WSi_xN_y$. Next, film 22 is grown by an intermixing growth process or by a deposition process over metallic barrier layer 16 in accordance with one or more embodiments of the present invention. Next, one or more seed layers 24 are deposited over film 22 in accordance with any one of a number of methods that are well known to those of ordinary skill in the art. Although FIGS. 2(a) and 2(b) show a single seed layer 24, it is within the scope of the invention that layer 24 may also comprise two or more layers, deposited in two or more steps, such as, for example and without limitation, where one step produces a relatively thick seed layer which may be non-conformal (or discontinuous), and another step produces a relatively thin conformal (i.e., continuous on the bottom 17 and sidewalls 15) seed layer.

In accordance with one or more embodiments of the present invention, a relatively thin conductive continuous (or conformal) Ru layer (such as deposited by PVD, ALD, or CVD techniques) serves as a barrier layer and/or as a seed layer, followed by a thicker PVD seed layer 24 (comprising Cu, Ag, or an alloy comprising one or more of these metals). The Ru layer can be used as a single barrier layer 16 or, preferably, in a combination (not shown) with one or more other metallic barrier layers (such as Ta, $TaN_X$ or bilayer $Ta/TaN_X$). While the conformal conductive Ru seed layer ensures continuous sidewalls and bottom coverage, the thicker PVD seed layer provides sufficient field surface conduction, required for void-free electrofilling and for adequate plating uniformity across a wafer. The interposed Ru layer provides good adhesion to both the refractory metal barrier 16 on one side and to Cu on the other side, thus serving as a "glue", enhancing strong adhesion between the two. When Ru layer is used as a single barrier layer 16, it also provides good adhesion to dielectric 11. In such embodiments, the Ru layer can be used in combinations with, or without, film 22.

As defined herein, "conformal" means "continuous", and "substantially conformal" means "substantially continuous" coverage of a layer on at least the sidewalls (preferably also on the bottom) of the openings.

In accordance with one or more preferred embodiments of the present invention, layer or film 22 comprises one or more of $CuS_X$, $Cu_2S_X$, $CuSe_X$, $Cu_2Se_X$, $CuTe_X$, $Cu_2Te_X$ (where $0.7 \leq X \leq 1.3$; and $X=1.0$ for stoichiometric compounds), and other materials comprising one or more of these compounds. In accordance with one or more further embodiments of the present invention, film 22 may also comprise silver sulfide ($AgS_X$ and/or $Ag_2S_X$, where $0.7 \leq X \leq 1.3$; and $X=1.0$ for stoichiometric compounds) and/or other mixtures of sulfides comprising one or more atoms selected from the group consisting of Cu and Ag. Advantageously in accordance with one or more embodiments of the present invention, it is believed that because film 22 is chemically bonded to barrier 16 and to copper (or silver) seed layer 24, film 22 adheres well to both. In accordance with one or more further embodiments of the present invention, a conductive conformal film 22 serves as a first seed layer, followed by a thicker PVD seed layer 24 (comprising Cu, Ag, or an alloy comprising one or more of these metals). While the first seed layer 22 ensures continuous sidewalls and bottom coverage, the thicker PVD seed layer provides sufficient field surface conduction, required for void-free electrofilling and for adequate plating uniformity across a wafer. As such, after electrofilling to form a copper (or silver) interconnect in opening 13, film 22 may advantageously also function as a passivation layer on sidewalls and/or on the bottom surfaces of the interconnect to reduce or eliminate EM and/or SIV, and to enhance adhesion between the copper (or silver) interconnect and metallic barrier 16. Film 22 may also function as a diffusion barrier to reduce or eliminate copper (or silver) outdiffusion into surrounding dielectric 11.

FIG. 2(b) shows a pictorial representation of a transverse (along the width) cross-section (not to scale for ease of understanding) of structure 210 used to fabricate, for example and without limitation, a semiconductor device that is the same as structure 200 shown in FIG. 2(a), except that barrier layer 16 is not used. In accordance with one or more such embodiments of the present invention, film 22 functions as a passivation film and/or as a diffusion barrier to prevent or reduce copper or silver outdiffusion, depending on the application, into dielectric 11 from an interconnect that is subsequently formed in opening 13.

In accordance with one or more embodiments of the present invention, film 22 in FIGS. 2(a) and 2(b) is substantially conformal (i.e., continuous) and may be utilized to passivate the sidewalls and bottom surfaces of an interconnect conductor that fills opening 13. In accordance with one or more such embodiments, the thickness of film layer 22 may be in a range from about 10 Å to about 500 Å and, more specifically in a range from about 20 Å to about 200 Å.

In accordance with one or more embodiments of the present invention, it is believed that copper atoms at interfaces with film 22, such as seed layer 24 and/or copper-filled conductor interconnect 18 (in FIG. 1), are chemically bound, for example and without limitation, in a chalcogenide compound comprised of one or more constituents that have a high affinity for copper.

A. Deposition

In accordance with one or more embodiments of the present invention, film 22 may be deposited using a: (a) dry deposition process such as, for example and without limitation, atomic layer deposition (ALD) or chemical vapor deposition (CVD); (b) physical vapor deposition (PVD) process such as, for example and without limitation, sputtering or evaporation; or (c) wet deposition process such as, for example and without limitation, chemical bath deposition, electrodeposition, or electroless deposition. In accordance with a preferred embodiment, film 22 is deposited by a conformal deposition process, such as ALD (preferably), CVD, electroless, or electrodeposition. For example and without limitation, in accordance with one or more embodiments, an ALD technique or a CVD technique may be used to deposit a conformal $CuS_X$ or $Cu_2S_X$ film 22 inside opening 13 of high aspect ratio (HAR). Such embodiments provide a continuous film 22 over sidewalls 15, which may even comprise negative slopes, nooks, crevices, or crannies. For an example of an ALD of $CuS_X$, see a publication entitled "Growth of conductive copper sulfide thin films by atomic layer deposition" by Johansson et al., in J. Mater. Chem., Vol. 12, pp. 1022-1026 (2002). For example and without limitation, organometallic precursors such as $Cu(thd)_2$, $Cu(hfac)_2$, or $(hfac)Cu(tmvs)$ can be reacted with $H_2S$ gas in ALD or CVD processes to deposit conformal $CuS_X$ or $Cu_2S_X$ films. Due to the high affinity of refractory metals to carbon and oxygen, a metallic barrier layer 16, which is based on a refractory metal or alloy, tends to form interfacial oxides and/or carbides by reacting with the organic part of the copper organometallic precursors. Such interfacial oxides and/or carbides may impair adhesion (and/or nucleation) of copper sulfide film 22 to metallic barrier 16. For this reason, other copper precursors comprising inorganic compounds which do not include carbon and/or oxygen atoms can be used. For example and without limitation, precursors comprising copper halides, such as copper chlorides, copper bromides, or copper iodides may be used instead of the copper organometallic precursors.

In accordance with one or more such embodiments, it is believed that advantageously strong adhesion is provided because at least one of such materials comprising film 22 (copper or silver chalcogenide) is chemically bonded to material at the underlying surfaces of barrier 16 and to overlying seed layer(s) 24. It is further believed that film 22 is chemically bonded to metallic barrier 16 underneath it by sharing chalcogenide atoms (S, Se, or Te) with it, and to seed layer(s) 24 above it by sharing chalcogenide atoms with film 24, thus providing excellent adhesion to both. As such, it is believed that film 22 can reduce or eliminate copper interfacial surface diffusion, and thereby reduce or eliminate electromigration (EM) and/or stress induced voids (SIV), while improving structural strength and integrity. It is also believed that chemical bonding is enhanced if the temperature of the substrate is elevated during deposition and/or during successive processing steps entailed in fabricating a device. When no barrier layer 16 is used, such as structure 210 of FIG. 2(b), it is similarly believed that adhesion of film 22 to dielectric 11 is promoted by sharing or substituting chalcogenide atoms or ions of S, Se, or Te with dielectric 11.

Film 22 can be grown on barrier layer 16 (FIG. 2(a)), or directly on dielectric 11 (FIG. 2(b)), by dry or by wet deposition techniques. The dry deposition techniques may include ALD, CVD, or PVD. Note that the ALD method may be particularly advantageous due to its highly conformal nature. As such, it can coat all surfaces continuously, including hard to reach negative slopes, crevices, nooks and crannies. For an example of a method for ALD deposition of copper sulfide, see an article by Johansson et al. entitled "Growth of conductive copper sulfide thin films by atomic layer deposition" in Journal of Materials Chemistry, 2002, vol. 12, pp. 1022-1026, incorporated herein by reference. The wet deposition techniques may include, for example and without limitation, electroless, electroplating, or chemical bath deposition techniques.

In one or more other embodiments, sulfur (atoms, molecules, or ions) are first deposited directly onto, and/or "impregnated" into, the surface of dielectric 11, and then reacted with a copper-bearing reactant (such as aqueous solution of cuprous or cupric ions) to form film 22 by intermixing growth. Such embodiments might be particularly useful when using porous low-k dielectric 11, capable of absorbing appreciable amounts of the sulfur species.

B. Intermixing Growth

In accordance with one or more embodiments of the present invention, layer 22 can be grown by an intermixing growth process by first depositing a thin layer of copper or silver (such as by ALD, CVD, electrodeposition, or electroless techniques) over barrier layer 16, followed by an intermixing growth process like those described above for growing film 12 of FIG. 1. Accordingly, film 22 is grown in two steps: (a) a copper (or silver) layer (not shown) is first deposited (by a dry or by a wet deposition technique on metallic barrier 16 or directly on dielectric 11 (see FIG. 2(*b*)) and, (b) reacting the copper (or silver) layer with a sulfur (or sellenium or tellurium) bearing reactant to form film 22 by intermixing growth. For example, a copper layer can be deposited on barrier 16 or directly on dielectric 11 by an ALD, CVD, PVD, or electroless technique, followed by reacting the copper (or silver) layer with a (wet or dry) sulfur-bearing reactant, such as $H_2S$ or elemental sulfur.

In yet another embodiment (not shown), one or more copper seed layer(s) 24 is first deposited over metallic barrier layer 16 (see FIG. 2(*a*)), and the copper seed layer (s) 24 is then reacted with a dry or wet chalcogenide-bearing reactant to form film 22. Partially consumed seed layer(s) 24 thus underlay film 22 (not shown), and electrofilling of opening 13 is performed directly onto film 22.

Advantageously, film 22 may provide improved device integrity and reliabilty because it may act to reduce voids in subsequently electroplated conductor that fills opening 13, when seed layer 24 is too thin and/or when seed layer(s) 24 is discontinuous on sidewalls 15.

Further Processing

1. In order to minimize via resistance, it may be desirable or advantageous to remove film 22 from bottom 17 of opening 13 (such as via in FIGS. 2(*a*) and 2(*b*)) prior to copper or silver filling. In accordance with one or more embodiments of the present invention, film 22 can be removed from bottom 17 of vias 13 by an etching step such as, for example and without limitation, using a directional dry etching technique such as sputter etching, ion milling, or reactive ion etching (RIE). Film 22 may also be removed from bottom 17 of via 13 by wet chemical etching such as, for example and without limitation, using $HNO_3$ and/or $H_2SO_4$. Structures comprising vias with layer 22 removed from bottom 17 are shown, for example and without limitation, in FIG. 4. Such removal (as well as the removal of barrier layer 16 from the via's bottom) ensures minimal via resistance, by providing copper to copper contact with a preceding (i.e., lower) metallization level (see 10 in FIG. 4). Removal of metallic barrier 16 from the via's bottom further improves device reliability by mitigating or eliminating EM and/or SIV problems related to the vias' bottom.

As was discussed above in conjunction with FIGS. 2(*a*) and 2(*b*), seed layer(s) 24 is deposited over film 22 inside opening 13 and over field 14. In accordance with one or more embodiments of the present invention, a continuous film 22 on the sidewalls 15 facilitates the use of a relatively thick seed layer 24 (which may be discontinuous inside the opening), which can be deposited, for example, by a PVD technique such as sputtering, ion plating, or evaporation. The main purpose of depositing the relatively thick seed layer 24 is to provide sufficient seed layer thickness for adequate surface conduction over field 14. Adequate surface conduction is required to minimize "terminal effect" (i.e., a thickness non-uniformity across a wafer due to IR-drop from the wafer's edge contact to its center). Adequate surface conduction is required for good uniformity of an electroplated conductor across a wafer and for void-free electrofilling. The thickness of seed layer 24 can be in a range from about 200 Å to about 2,000 Å over field 14, and more particularly in a range from about 300 Å to about 1,000 Å over field 14. As is discussed below, in accordance with one or more embodiments of the present invention, seed layer 24 (which may be discontinuous inside the opening) may also be used as a (sacrificial) mask during removal of film 22 and/or metallic barrier layer 16 from a via's bottom 17.

2. In still another embodiment, as shown in FIG. 2(*b*), film 22 may be formed directly (without barrier layer 16) over dielectric 11 and over substrate 10 at bottom 17 of opening 13 and, following its formation, a non-conformal seed layer 24 is deposited over film 22. Then, if desired, film 22 may be removed from bottom 17 by an etching step, using non-conformal seed layer 24 as a mask to protect layer 22 over field 14 and sidewalls 15. The etching can be performed by wet chemical etching (for example, with $HNO_3$ and/or $H_2SO_4$) or, more preferably, by directional (anisotropic) dry etching such as by sputter etching, ion milling, or reactive ion etching (RIE). Then, in order to improve conduction of sidewalls 15, a relatively thin conformal seed layer (not shown) may be deposited over the entire structure. The conformal seed layer may be deposited following the step of removing film 22 from bottom 17. The conformal seed layer may preferably be deposited by an ALD or a CVD technique. However, it may also be deposited by any other conformal deposition technique, such as electroless or electrodeposition. In an alternative embodiment, a relatively thin conformal seed layer can be deposited as part of a combined seed layers 24 directly over film 22, followed by the deposition of a thicker seed layer (which can be non-conformal), to form a combined seed layer 24. This embodiment is particularly advantageous in embodiments where there is no removal of film 22 from the bottom 17.

3. In accordance with one or more further embodiments, film 22 may also serve as a conformal seed layer. In accordance with further such embodiments, another seed layer, which may be non-conformal, can be deposited thereon.

Further Structures

1. FIG. 3(*a*) shows a pictorial representation of a transverse (along the width) cross-section (not to scale for ease of understanding) of structure 300 used to fabricate, for example and without limitation, a conductor line in a metallic interconnect in a semiconductor device. Structure 300 comprises an embedded or filled conductive interconnect 18 in dielectric 11, with its sidewalls 15 encased with film 30, and its top surface covered with capping film 32, in accordance with one or more embodiments of the present invention. Capping film 32 may be fabricated using any of the above-described methods relating to film 12 of FIGS. 1(*a*) and 1(*b*). FIG. 3(*a*) also shows metallic barrier layer 16 formed over sidewalls 15 and bottom 17 of the interconnect line embedded in dielectric 11. FIG. 3(*a*) also shows a film or layer 30 disposed between metallic barrier layer 16 and metallic conductor 18. Film 30 may be fabricated using any of the above-described methods relating to film 22 of FIGS. 2(*a*) and 2(*b*). In accordance with one or more embodiments of the invention, film (or layer) 30 passivates the sides of conductor 18 (which conductor may comprise Cu, Ag, or an alloy comprising one or more of these metals), and capping film (or layer) 32 passivates the top surface of conductor 18. Structure 300 shown in FIG. 3(*a*) may be fabricated by starting with structure 200 shown in FIG. 2(*a*), electrofilling opening 13 with conductor 18, and removing by a planarization technique, such as, for example, a CMP technique, the excess plated conductor 18 over opening 13 (not shown), and the metallic barrier 16 and film 22 from the field 14 of dielectric 11. What was film 22 in FIG. 2(*a*), will thus end up as film (or layer) 30 in FIG. 3(*a*). As for film 22 described above, layer 30 advantageously comprises one or more chalcogenide materials selected from the group consisting of copper sulfide, copper selenide, copper telluride, silver sulfide, silver selenide, silver telluride, and mixtures of two or more of these chalcogenides.

Advantageously, in accordance with one or more embodiments of the present invention, it is believed that because film 30 is chemically bonded to metallic barrier layer 16 and to copper (or silver) conductor 18, film 30 adheres well to both. As such, film 30 may advantageously function as a passivation layer on sidewalls 15 and bottom 17 and/or as a barrier layer against copper (or silver) outdiffusion into surrounding dielectric 11, thereby reducing or eliminating EM and/or SIV. Similarly, it is believed that because film 32 is chemically bonded (and adheres well) to conductor 18, film 32 may function as a passivation capping and/or barrier capping layer over conductor 18.

Figure 3A:
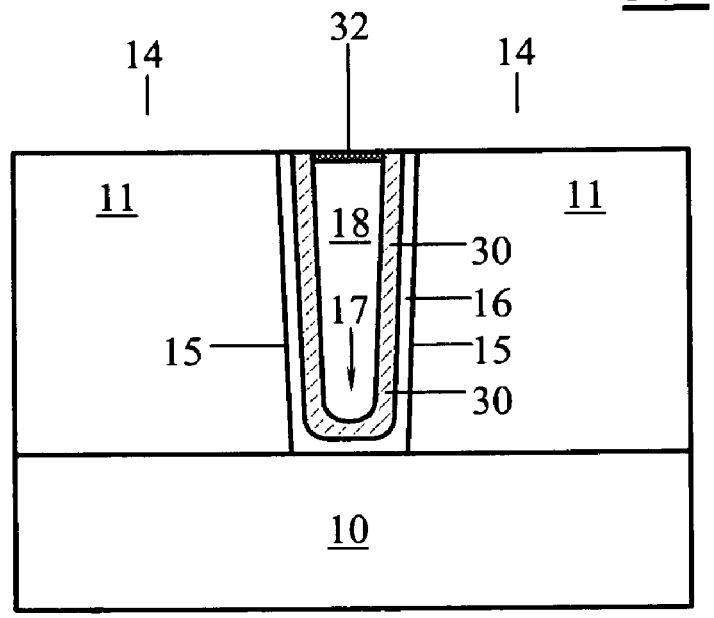
FIGS. 3(a)-3(b) show a pictorial representation of a transverse (along the width) cross-section of an embedded (or filled) conductive interconnect with its sidewalls covered with a conformal passivation and/or diffusion barrier film, and its top surface covered with a passivation capping film in accordance with one or more embodiments of the present invention.
Figure 3B:
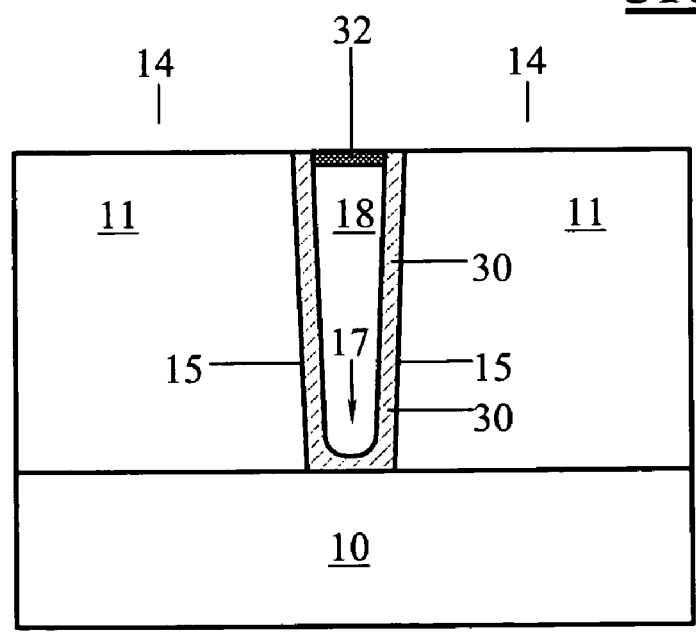

FIG. 3(b) shows a structure 310, similar to structure 300 of FIG. 3(a), but without metallic barrier layer 16. In accordance with one or more embodiments of the present invention, film 30 functions as a passivation layer and/or as a barrier layer against outdiffusion of conductor 18 into dielectric 11.

Figure 4A:
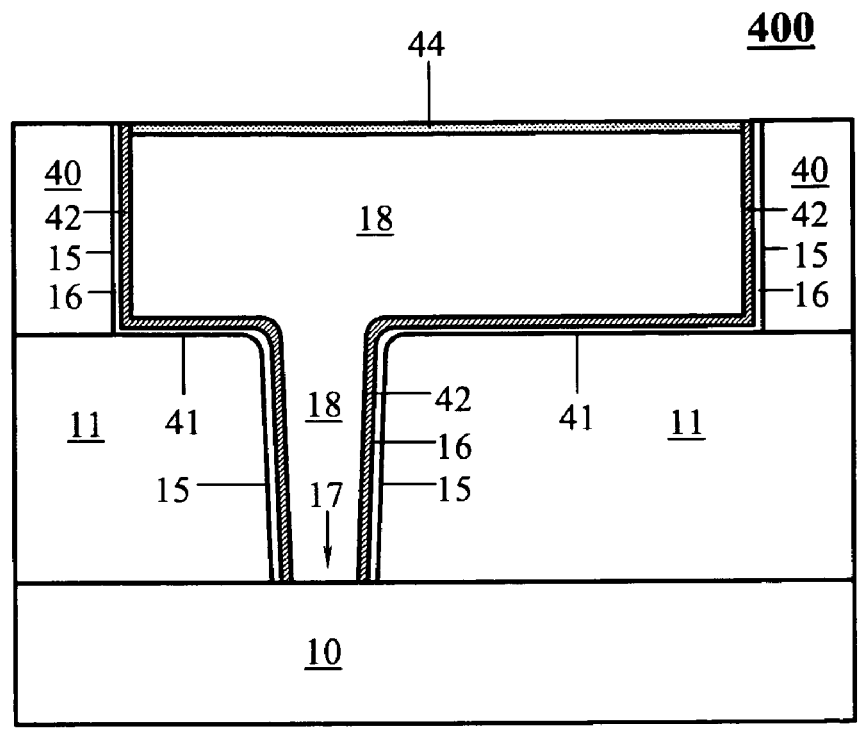
FIGS. 4(a)-4(b) show a pictorial representation of a longitudinal (along the length) cross-section of an embedded (or filled) Dual Damascene conductive interconnect where the interconnect is encased by a passivation and/or diffusion barrier film on its sidewalls and bottom surfaces, and its top surface is covered with a passivation capping film in accordance with one or more embodiments of the present invention.

2. FIG. 4(a) shows a pictorial representation of a longitudinal (along the length) cross-section (not to scale for ease of understanding) of structure 400 used to fabricate, for example and without limitation, a Dual Damascene metallic interconnect in a semiconductor device. Structure 400 comprises an embedded or filled conductive interconnect 18 in dielectrics 11 and 40. Conductive interconnect 18 is encased by film 42 at sidewalls 15 and (line) bottom 41, and its top surface is covered with film 44, in accordance with one or more embodiments of the present invention. Structure 400 also comprises a metallic barrier layer 16 formed over sidewalls 15 of dielectrics 11, 40 and over line bottom 41. In accordance with one or more embodiments of the invention, film (or layer) 42 passivates the sides of conductor 18 (which conductor may comprise Cu, Ag, or an alloy comprising one or more of these metals), and capping film (or layer) 44 passivates the top surface of conductor 18. In accordance with one or more embodiments of the invention, film 42 and/or barrier 16 are removed from bottom 17 of the via, as shown in FIG. 4(a).

In accordance with one or more embodiments of the present invention, layers or films 42, 44 comprise one or more of $CuS_X$, $Cu_2S_X$, $CuSe_X$, $Cu_2S_X$, $CuTe_X$, $Cu_2Te_X$ (where $0.7 \leq X \leq 1.3$; and $X=1.0$ for stoichiometric compounds), and other materials comprising one or more of these compounds. In accordance with one or more further embodiments of the present invention, films 42, 44 may comprise silver sulfide ($AgS_X$ and/or $Ag_2S_X$, where $0.7 \leq X \leq 1.3$; and $X=1.0$ for stoichiometric compounds) and/or other mixtures of sulfides comprising one or more atoms selected from the group consisting of Cu and Ag. Advantageously in accordance with one or more embodiments of the present invention, it is believed that because film 42 is chemically bonded to metallic barrier layer 16 and to copper (or silver) conductor 18, film 42 adheres well to both. As such, film 42 may advantageously function as a passivation layer on sidewalls 15 and/or a barrier layer against copper (or silver) outdiffusion into surrounding dielectrics 11, 40, thereby reducing or eliminating EM and/or SIV. Similarly, it is believed that because film 44 is chemically bonded (and adheres well) to the top of conductor 18, film 44 may function as a passivation capping and/or barrier capping layer over conductor 18. Film 42 can be deposited or grown by a deposition process or by an intermixing process, similar to deposition or growth of film 22 (in FIGS. 2(a) and 2(b)), in accordance with one or more embodiments described above. Film 44 can be grown by an intermixing process or deposited similar to growth or deposition of film 12 (in FIGS. 1(a) and 1(b)), in accordance with one or more embodiments described above.

Figure 4B:
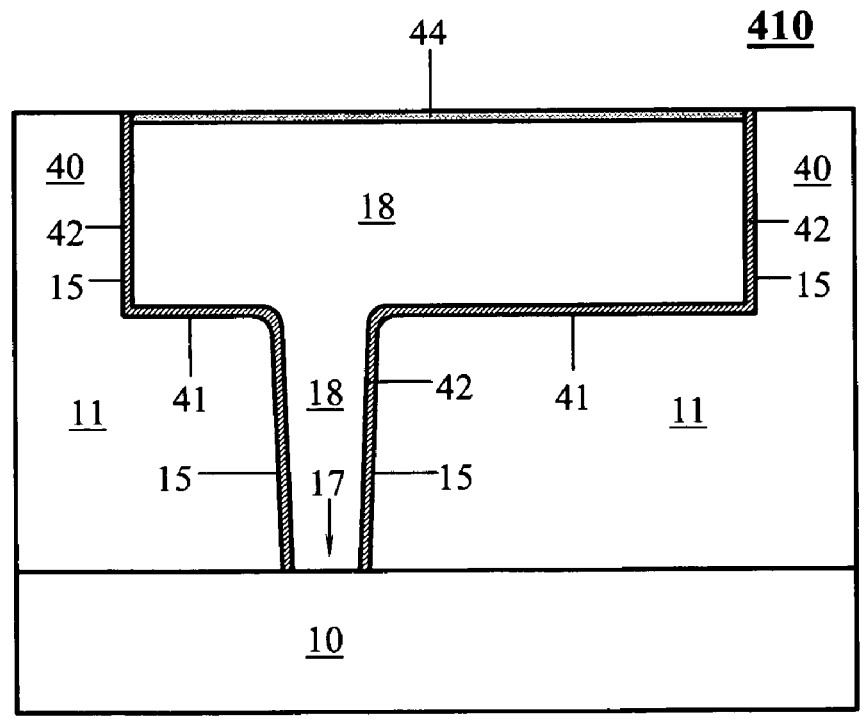

FIG. 4(b) shows a structure 410, similar to structure 400 of FIG. 4(a), but without metallic barrier layer 16. In accordance with one or more embodiments of the present invention, film 42 functions as a passivation layer and/or as a barrier layer against outdiffusion of conductor 18 into dielectrics 11 and 40.

Although the description of the embodiments and examples above has concentrated on metallic interconnect structures used to fabricate a device such as a semiconductor integrated circuits, these embodiments can also be used in the fabrication of other devices, such as (coils in) thin film heads, Micromachined Microelectromechanical Systems (MEMS) devices, or interconnects in high density integrated circuit packages.

Those skilled in the art will recognize that the foregoing description has been presented for the sake of illustration and description only. As such, it is not intended to be exhaustive or to limit the invention to the precise form disclosed.

What I claim is:

1. An interconnect line structure having sidewalls and bottom interfaces, said interconnect line structure comprising:
   a metallic conductor embedded in at least one surrounding dielectric layer, said metallic conductor comprising a metal or alloy chosen from a group consisting of Cu, Ag, and alloys comprising one or more of these metals;
   one or more metallic barrier layers disposed between said metallic conductor and said at least one surrounding dielectric layer along the sidewalls and bottom interfaces; and
   a passivation layer disposed between said metallic conductor and said one or more metallic barrier layers along the sidewalls and bottom interfaces, said passivation layer comprising a material selected from the group consisting of copper sulfide, silver sulfide, copper selenide, silver selenide, copper telluride, silver telluride, and mixtures comprising two or more of these materials, wherein the copper sulfide refers to $CuS_X$ or $Cu_2S_X$, the silver sulfide refers to $AgS_X$ or $Ag_2S_X$, the copper selenide refers to $CuSe_X$ or $Cu_2Se_X$, and the copper telluride refers to $CuTe_X$ or $Cu_2Te_X$, and wherein $0.7 \leq X \leq 1.3$.

2. The interconnect line structure of claim 1 wherein said one or more metallic barrier layers comprises Ta, $TaN_X$, bilayer Ta/$TaN_X$, Ru, $TaSi_XN_Y$, $WN_X$, bilayer Ti/$TiN_X$, $TiSi_XN_Y$, $WSi_XN_Y$, or a refractory metal alloy thereof.

3. The interconnect line structure of claim 2 wherein said one or more metallic barrier layers comprises Ta, $TaN_X$, or bilayer Ta/$TaN_X$.

4. The interconnect line structure of claim 1 further including a capping passivation film disposed directly on the metallic conductor, wherein said capping passivation film comprises one or more materials selected from the group consisting of copper sulfide, silver sulfide, copper selenide, silver selenide, copper telluride, and silver telluride, wherein the copper sulfide refers to $CuS_X$ or $Cu_2S_X$, the silver sulfide refers to $AgS_X$ or $Ag_2S_X$, the copper selenide refers to $CuSe_X$ or $Cu_2Se_X$, and the copper telluride refers to $CuTe_X$ or $Cu_2Te_X$, and wherein $0.7 \leq X \leq 1.3$.

5. The interconnect line structure of claim 4 wherein said passivation layer and said capping passivation film each comprises the copper sulfide.

6. The interconnect line structure of claim 1 further including one or more seed layers disposed over the passivation layer.

7. The interconnect line structure of claim 6 wherein said one or more seed layers comprises a first seed layer comprising Ru, and a second seed layer comprising Cu or copper alloy, said second seed layer being disposed over the first seed layer.

8. The interconnect line structure of claim 1 wherein the passivation layer has a thickness in a range from about 10 Å to about 200 Å.

9. The interconnect line structure of claim 4 wherein the capping passivation film has a thickness in a range from about 10 Å to about 200 Å.

10. An interconnect line structure having sidewalls and bottom interfaces, said interconnect line structure comprising:
- a metallic conductor embedded in at least one surrounding dielectric layer, said metallic conductor comprising a metal or alloy chosen from a group consisting of Cu, Ag, and alloys comprising one or more of these metals;
- one or more metallic barrier layers disposed between said metallic conductor and said at least one surrounding dielectric layer along the sidewalls and bottom interfaces;
- a ruthenium (Ru) layer disposed between said metallic conductor and said one or more metallic barrier layers along the sidewalls and bottom interfaces;
- a capping passivation film disposed directly on the metallic conductor but not over the at least one surrounding dielectric layer, said capping passivation film comprising one or more materials selected from the group consisting of copper sulfide, silver sulfide, copper selenide, silver selenide, copper telluride, and silver telluride, wherein the copper sulfide refers to $CuS_X$ or $Cu_2S_X$, the silver sulfide refers to $AgS_X$ or $Ag_2S_X$, the copper selenide refers to $CuSe_X$ or $Cu_2Se_X$, and the copper telluride refers to $CuTe_X$ or $Cu_2Te_X$, and wherein $0.7 \leq X \leq 1.3$; and
- a capping dielectric diffusion barrier layer disposed directly on the capping passivation film.

11. The interconnect line structure of claim 10 further comprising one or more seed layers disposed between the ruthenium (Ru) layer and the metallic conductor along the sidewalls and bottom interfaces.

12. The interconnect line structure of claim 11 wherein the capping passivation film comprises the copper sulfide.

13. The interconnect line structure of claim 12 wherein the capping passivation film has a thickness in a range from about 50 Å to about 200 Å.

14. The interconnect line structure of claim 13 wherein the capping dielectric diffusion barrier layer comprises a material selected from a group consisting of silicon nitride, silicon carbide, silicon carbide nitride, silicon carbide nitride oxide, silicon nitride oxide, $SiC_XH_Y$, and $SiC_XO_YH_Z$.

* * * * *